United States Patent
Shimomura et al.

(10) Patent No.: US 11,495,679 B2
(45) Date of Patent: *Nov. 8, 2022

(54) SEMICONDUCTOR DEVICE AND METHOD FOR MANUFACTURING THE SAME

(71) Applicants: Kabushiki Kaisha Toshiba, Tokyo (JP); Toshiba Electronic Devices & Storage Corporation, Tokyo (JP)

(72) Inventors: Saya Shimomura, Komatsu Ishikawa (JP); Tetsuya Ohno, Yokohama Kanagawa (JP); Hiroaki Katou, Nonoichi Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/393,650

(22) Filed: Aug. 4, 2021

(65) Prior Publication Data
US 2021/0367072 A1   Nov. 25, 2021

Related U.S. Application Data

(63) Continuation of application No. 16/560,079, filed on Sep. 4, 2019, now Pat. No. 11,164,968.

(30) Foreign Application Priority Data

Mar. 15, 2019   (JP) .............................. JP2019-048842

(51) Int. Cl.
*H01L 29/78*     (2006.01)
*H01L 29/40*     (2006.01)
(Continued)

(52) U.S. Cl.
CPC .... *H01L 29/7813* (2013.01); *H01L 21/02129* (2013.01); *H01L 21/02164* (2013.01);
(Continued)

(58) Field of Classification Search
CPC .............. H01L 29/407; H01L 29/7813; H01L 29/66734; H01L 29/41766; H01L 29/7397;
(Continued)

(56) References Cited

U.S. PATENT DOCUMENTS 7,745,877 B2   6/2010   Saka et al.
8,637,367 B2   1/2014   Poelzl
(Continued)

FOREIGN PATENT DOCUMENTS

JP   2000-31266 A    1/2000
JP   2007-258582 A   10/2007
(Continued)

*Primary Examiner* — Samuel Park
(74) *Attorney, Agent, or Firm* — Allen & Overy LLP

(57) ABSTRACT

According to one embodiment, a semiconductor device includes first and second electrodes, first, second and third semiconductor regions, a first conductive portion, a gate electrode, and a second insulating portion. The first and second semiconductor regions are provided on the first semiconductor region. The third semiconductor regions are selectively provided respectively on the second semiconductor regions. The first conductive portion is provided inside the first semiconductor region with a first insulating portion interposed. The gate electrode is provided on the first conductive portion and the first insulating portion and separated from the first conductive portion. The gate electrode includes first and second electrode parts. The second insulating portion is provided between the first and second electrode parts. The second insulating portion includes first
(Continued)

and second insulating parts. The second electrode is provided on the second and third semiconductor regions.

14 Claims, 12 Drawing Sheets

(51) Int. Cl.
 *H01L 21/02* (2006.01)
 *H01L 29/66* (2006.01)
(52) U.S. Cl.
 CPC .. *H01L 21/02236* (2013.01); *H01L 21/02271* (2013.01); *H01L 29/401* (2013.01); *H01L 29/407* (2013.01); *H01L 29/408* (2013.01); *H01L 29/66734* (2013.01)
(58) Field of Classification Search
 CPC ........... H01L 29/0696; H01L 29/42368; H01L 29/4236; H01L 29/1095; H01L 29/42376; H01L 29/7811; H01L 29/0878; H01L 29/4238; H01L 29/0623; H01L 29/402; H01L 29/404; H01L 29/7802; H01L 29/0634; H01L 29/66348; H01L 29/0649; H01L 29/66727; H01L 29/7396; H01L 21/02129; H01L 21/02164; H01L 21/02236; H01L 21/02271; H01L 29/401; H01L 29/408; H01L 29/78; H01L 29/0603; H01L 29/0684; H01L 29/66477
 See application file for complete search history.

(56) References Cited

U.S. PATENT DOCUMENTS

| 9,337,283 | B2 | 5/2016 | Nishiguchi | |
|---|---|---|---|---|
| 2007/0138547 | A1 | 6/2007 | Nakamura | |
| 2008/0150018 | A1 | 6/2008 | Tanabe | |
| 2009/0263952 | A1* | 10/2009 | Viswanathan | H01L 29/407 438/270 |
| 2012/0199899 | A1* | 8/2012 | Kobayashi | H01L 29/66734 438/270 |
| 2013/0248993 | A1 | 9/2013 | Sedlmaier et al. | |
| 2014/0284773 | A1* | 9/2014 | Nishiguchi | H01L 29/42368 438/597 |

FOREIGN PATENT DOCUMENTS

| JP | 2008-98593 A | 4/2008 |
|---|---|---|
| JP | 2008-160039 A | 7/2008 |
| JP | 5799046 B2 | 10/2015 |

* cited by examiner

SEMICONDUCTOR DEVICE AND METHOD FOR MANUFACTURING THE SAME

CROSS-REFERENCE TO RELATED APPLICATIONS

This application is a continuation of U.S. application Ser. No. 16/560,079 filed on Sep. 4, 2019 and based upon and claims the benefit of priority from Japanese Patent Application No. 2019-048842, filed on Mar. 15, 2019; the entire contents of which are incorporated herein by reference.

FIELD

Embodiments described herein relate generally to a semiconductor device and a method for manufacturing the same.

BACKGROUND

A semiconductor device such as a MOSFET (Metal Oxide Semiconductor Field Effect Transistor) is used in power conversion and the like. A semiconductor device is desirable in which breakdown does not occur easily.

DETAILED DESCRIPTION

Figure 1:
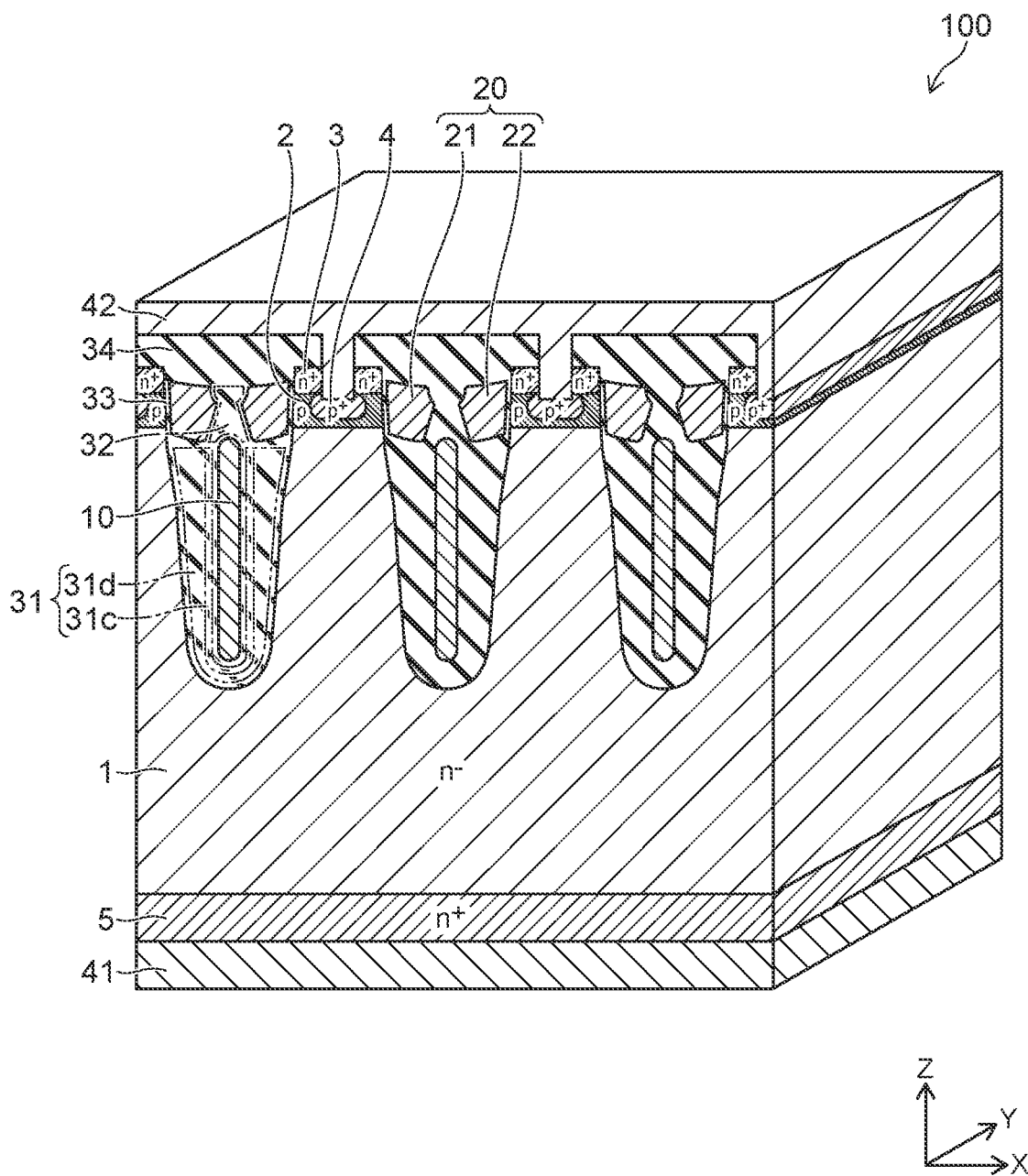
FIG. 1 is a perspective cross-sectional view illustrating a portion of a semiconductor device according to an embodiment.

According to one embodiment, a semiconductor device includes a first electrode, a first semiconductor region of a first conductivity type, a plurality of second semiconductor regions of a second conductivity type, a plurality of third semiconductor regions of the first conductivity type, a first conductive portion, a gate electrode, a second insulating portion, and a second electrode. The first semiconductor region is provided on the first electrode and electrically connected to the first electrode. The second semiconductor regions are provided on the first semiconductor region. The third semiconductor regions are selectively provided respectively on the second semiconductor regions. The first conductive portion is provided inside the first semiconductor region with a first insulating portion interposed. The gate electrode is provided on the first conductive portion and the first insulating portion and separated from the first conductive portion. The gate electrode includes a first electrode part and a second electrode part. The first electrode part opposes, in a first direction with a first gate insulating portion interposed, a portion of the first semiconductor region, one of the second semiconductor regions, and one of the third semiconductor regions. The first direction is perpendicular to a second direction. The second direction is from the first electrode toward the first semiconductor region. The second electrode part is positioned between the first electrode part and another one of the third semiconductor regions in the first direction. The second electrode portion opposes, with a second gate insulating portion interposed, another portion of the first semiconductor region, another one of the second semiconductor regions, and the other one of the third semiconductor regions. The second insulating portion is provided between the first electrode part and the second electrode part in the first direction. The second insulating portion includes a first insulating part and a second insulating part. A length in the first direction of the first insulating part becomes shorter along the second direction. The second insulating part includes a portion positioned on the first insulating part. A length in the first direction of the portion becomes longer or is constant along the second direction. A length in the second direction of the first insulating part is longer than a length in the second direction of the second insulating part. The second electrode is provided on the second semiconductor regions and the third semiconductor regions. The second electrode is electrically connected to the second semiconductor regions, the third semiconductor regions, and the first conductive portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the drawings and the description recited below, the notations of n$^+$, n$^-$, p$^+$, and p indicate relative levels of the impurity concentrations. In other words, a notation marked with "+" indicates that the impurity concentration is relatively higher than that of a notation not marked with either "+" or "−;" and a notation marked with "−" indicates that the impurity concentration is relatively lower than that of a notation without any mark. In the case where both a p-type impurity and an n-type impurity are included in each region, these notations indicate relative levels of the net impurity concentrations after the impurities are compensated.

In the embodiments described below, each embodiment may be performed by inverting the p-type and the n-type of each semiconductor region.

FIG. 1 is a perspective cross-sectional view illustrating a portion of a semiconductor device according to an embodiment.

The semiconductor device 100 according to the embodiment illustrated in FIG. 1 is a MOSFET. The semiconductor device 100 according to the embodiment includes an n$^-$-type (first conductivity-type) drift region 1 (a first semiconductor region), a p-type (second conductivity-type) base region 2 (a second semiconductor region), an n$^+$-type source region 3 (a third semiconductor region), a p$^+$-type contact region 4, an n$^+$-type drain region 5, a conductive portion 10, a gate electrode 20, a first insulating portion 31, a second insulating portion 32, a gate insulating portion 33, an insulating portion 34, a drain electrode 41 (a first electrode), and a source electrode 42 (a second electrode).

An XYZ orthogonal coordinate system is used in the description of the embodiments. Here, the direction from the drain electrode 41 toward the n⁻-type drift region 1 is taken as a Z-direction (a second direction). Two mutually-orthogonal directions perpendicular to the Z-direction are taken as an X-direction (a first direction) and a Y-direction (a third direction). For the description, the direction from the drain electrode 41 toward the n⁻-type drift region 1 is called "up;" and the reverse direction is called "down." These directions are based on the relative positional relationship between the drain electrode 41 and the n⁻-type drift region 1 and are independent of the direction of gravity.

The drain electrode 41 is provided at the lower surface of the semiconductor device 100. The n⁺-type drain region 5 is provided on the drain electrode 41 and is electrically connected to the drain electrode 41. The n⁻-type drift region 1 is provided on the n⁺-type drain region 5. The n⁻-type drift region 1 is electrically connected to the drain electrode 41 via the n⁺-type drain region 5. The p-type base region 2 is provided on the n⁻-type drift region 1. The n⁺-type source region 3 and the p⁺-type contact region 4 are provided selectively on the p-type base region 2.

The conductive portion 10 is a field plate electrode and is provided inside the n⁻-type drift region 1 with the first insulating portion 31 interposed. The first insulating portion 31 is a field plate insulating film and insulates the conductive portion 10 from the other regions. The gate electrode 20 is provided on the conductive portion 10 and the first insulating portion 31. The specific structure of the gate electrode 20 vicinity is described below.

The source electrode 42 is provided on the n⁺-type source region 3 and the p⁺-type contact region 4 and is electrically connected to the conductive portion 10, the n⁺-type source region 3, and the p⁺-type contact region 4. The insulating portion 34 is provided between the gate electrode 20 and the source electrode 42. The insulating portion 34 is an interlayer insulating film; and the gate electrode 20 and the source electrode 42 are electrically isolated.

A plurality of each of the regions provided in the semiconductor device 100, e.g., the p-type base region 2, the n⁺-type source region 3, the p⁺-type contact region 4, the conductive portion 10, and the gate electrode 20, is provided in the X-direction; and each extends in the Y-direction. The source electrode 42 is electrically connected to the multiple p-type base regions 2, the multiple n⁺-type source regions 3, and the multiple conductive portions 10.

Figure 2:
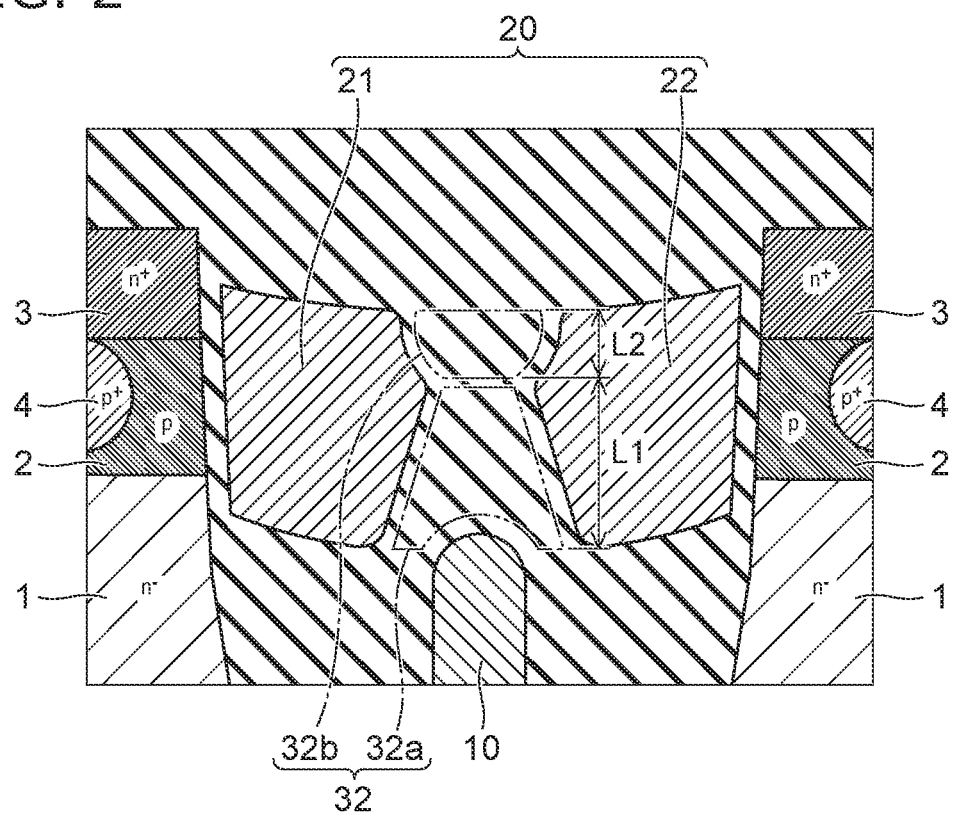
FIG. 2 is a cross-sectional view of an enlargement of a portion of FIG. 1.

FIG. 2 is a cross-sectional view of an enlargement of a portion of FIG. 1.

As illustrated in FIG. 1 and FIG. 2, each gate electrode 20 includes a first electrode part 21 and a second electrode part 22 separated from each other in the X-direction. The second insulating portion 32 is provided between the first electrode part 21 and the second electrode part 22.

The first electrode part 21 is positioned between the second electrode part 22 and one of the multiple n⁺-type source regions 3 in the X-direction. The second electrode part 22 is positioned between the first electrode part 21 and another one of the multiple n⁺-type source regions 3 in the X-direction.

The first electrode part 21 opposes, in the X-direction with the gate insulating portion 33 (a first gate insulating portion) interposed, a portion of the n⁻-type drift region 1, one of the multiple p-type base regions 2, and the one of the multiple n⁺-type source regions 3. The second electrode part 22 opposes, in the X-direction with another gate insulating portion 33 (a second gate insulating portion) interposed, another portion of the n⁻-type drift region 1, another one of the multiple p-type base regions 2, and the other one of the multiple n⁺-type source regions 3.

As illustrated in FIG. 2, the second insulating portion 32 includes a first insulating part 32a and a second insulating part 32b. The first insulating part 32a and the second insulating part 32b are positioned between the first electrode part 21 and the second electrode part 22 in the X-direction.

The length in the X-direction of the first insulating part 32a becomes shorter upward (along the Z-direction). Thereby, for example, the length in the X-direction of the first electrode part 21 lower portion arranged with the first insulating part 32a in the X-direction becomes longer upward. The length in the X-direction of the second electrode part 22 lower portion arranged with the first insulating part 32a in the X-direction becomes longer upward.

The length in the X-direction of the second insulating part 32b becomes longer upward. Thereby, for example, the length in the X-direction of the first electrode part 21 upper portion arranged with the second insulating part 32b in the X-direction becomes shorter upward. The length in the X-direction of the second electrode part 22 upper portion arranged with the second insulating part 32b in the X-direction becomes shorter upward. The length in the X-direction of the second insulating portion 32 has a minimum point between the first insulating part 32a and the second insulating part 32b.

In the example of FIG. 2, the length in the X-direction becomes longer upward over the entire second insulating part 32b. The configuration is not limited to the example; the length in the X-direction of a portion of the second insulating part 32b may become longer upward; and the length in the X-direction of another portion of the second insulating part 32b may become shorter upward. The other portion of the second insulating part 32b is provided on the portion of the second insulating part 32b. The length in the X-direction of at least a portion of the second insulating part 32b may be constant along the Z-direction. It is sufficient for the second insulating part 32b to include a portion that is positioned on the first insulating part 32a and has a length in the X-direction that is constant or becomes longer upward.

The operation of the semiconductor device 100 will now be described.

A voltage that is not less than a threshold is applied to the gate electrode 20 in a state in which a voltage that is positive with respect to the source electrode 42 is applied to the drain electrode 41. Thereby, a channel (an inversion layer) is formed in the p-type base region 2; and the semiconductor device 100 is set to the on-state. Electrons from the source electrode 42 pass through the channel and flow toward the drain electrode 41. Subsequently, when the voltage applied to the gate electrode 20 becomes lower than the threshold, the channel in the p-type base region 2 disappears; and the semiconductor device 100 is set to the off-state.

When the semiconductor device 100 is switched to the off-state, the voltage that is positive with respect to the source electrode 42 and is applied to the drain electrode 41 increases. Due to the increase of the positive voltage, a depletion layer spreads from the interface between the first insulating portion 31 and the n⁻-type drift region 1 toward the n⁻-type drift region 1. The breakdown voltage of the semiconductor device 100 can be increased by the spreading of the depletion layer. Or, the on-resistance of the semiconductor device 100 can be reduced by increasing the n-type impurity concentration in the n⁻-type drift region 1 while maintaining the breakdown voltage of the semiconductor device 100.

Examples of the materials of the components of the semiconductor device 100 will now be described.

The n⁻-type drift region 1, the p-type base region 2, the n⁺-type source region 3, the p⁺-type contact region 4, and the n⁺-type drain region 5 include silicon (Si) or silicon carbide (SiC) as semiconductor materials. In the case where silicon is used as the semiconductor material, arsenic (As), phosphorus (P), or antimony (Sb) can be used as an n-type impurity. Boron (B) can be used as a p-type impurity.

The conductive portion 10 and the gate electrode 20 include a conductive material such as polysilicon, etc. An impurity may be added to the conductive material.

The first insulating portion 31, the second insulating portion 32, the gate insulating portion 33, and the insulating portion 34 include an insulating material such as silicon oxide, etc. The first insulating portion 31 and the second insulating portion 32 may include an impurity (e.g., boron).

The drain electrode 41 and the source electrode 42 include a metal such as aluminum, etc.

As illustrated in FIG. 1, the first insulating portion 31 includes, for example, a third insulating part 31c and a fourth insulating part 31d. The third insulating part 31c contacts the conductive portion 10. The fourth insulating part 31d is positioned between the n⁻-type drift region 1 and the third insulating part 31c. For example, the third insulating part 31c includes silicon oxide and boron. The fourth insulating part 31d includes silicon oxide. The fourth insulating part 31d may further include boron. The boron concentration of the third insulating part 31c is higher than the boron concentration of the fourth insulating part 31d.

FIG. 3A to FIG. 6B are process cross-sectional views illustrating manufacturing processes of the semiconductor device according to the embodiment.

An example of a method for manufacturing the semiconductor device 100 according to the embodiment will now be described with reference to FIG. 3A to FIG. 6B.

Figure 3A:
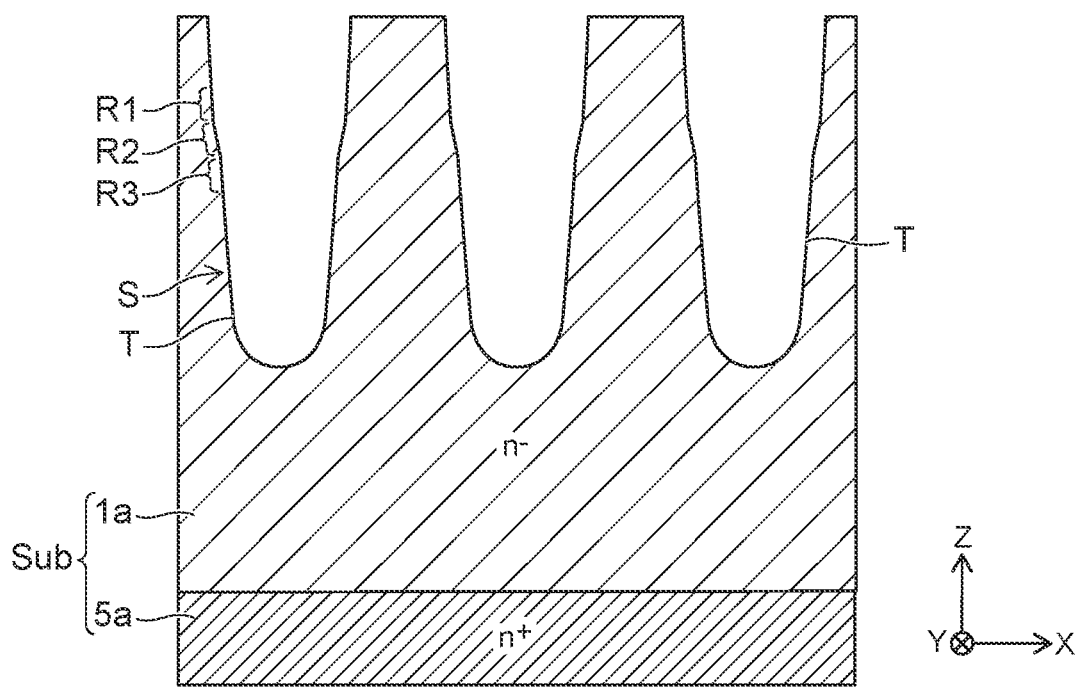
FIG. 3A to FIG. 6B are process cross-sectional views illustrating manufacturing processes of the semiconductor device according to the embodiment.

First, a semiconductor substrate Sub is prepared. The semiconductor substrate Sub includes an n⁺-type semiconductor region 5a, and an n⁻-type semiconductor region 1a provided on the n⁺-type semiconductor region 5a. As illustrated in FIG. 3A, multiple trenches T that extend along the Y-direction are formed in the upper surface of the n⁻-type semiconductor region 1a by reactive ion etching (RIE).

The side wall S of the trench T that crosses the X-direction includes a first region R1, a second region R2, and a third region R3. The first region R1 is positioned higher than the second region R2; and the second region R2 is positioned higher than the third region R3. The tilts with respect to the Z-direction of the first region R1 and the third region R3 are smaller than the tilt with respect to the Z-direction of the second region R2.

For example, when the position in the Z-direction of the upper end of the trench T is taken as 0 and the position in the Z-direction of the lower end of the trench T is taken as 1, the position in the Z-direction of the whole of the first region R1 is between 0.2 and 0.3. The position in the Z-direction of the whole of the second region R2 is between 0.3 and 0.4. The position in the Z-direction of the whole of the third region R3 is between 0.4 and 0.5.

The tilts with respect to the Z-direction of part of the side wall S located above the first region R1 may be the same as the tilts of the first region R1. The tilts with respect to the Z-direction of another part of the side wall S located below the third region R3 may be the same as the tilts of the third region R3.

As an example, the tilt with respect to the Z-direction of the first region R1 and the tilt with respect to the Z-direction of the third region R3 are not less than 0 degrees and not more than 2 degrees. The tilt with respect to the Z-direction of the second region R2 is greater than 2 degrees and not more than 4 degrees. It is desirable for the difference between the tilt with respect to the Z-direction of the first region R1 and the tilt with respect to the Z-direction of the second region R2 to be not less than 0.9 degrees and not more than 2.0 degrees. It is desirable for the difference between the tilt with respect to the Z-direction of the third region R3 and the tilt with respect to the Z-direction of the second region R2 to be not less than 0.9 degrees and not more than 2.0 degrees.

The trench T is formed by the following first to third steps. In the first step, the side wall that includes the first region R1 is formed. In the second step after the first step, the side wall that includes the second region R2 is formed. In the third step after the second step, the side wall that includes the third region R3 is formed. In the first step and the third step, a portion of the n⁻-type semiconductor region 1a is removed using a condition having high anisotropy. Compared to the first step and the third step, a portion of the n⁻-type semiconductor region 1a that is removed in the second step is removed using a condition having low anisotropy.

For example, the first to third steps are performed by RIE while supplying a gas including sulfur hexafluoride ($SF_6$), chlorine ($Cl_2$), and oxygen ($O_2$). The flow rate of the oxygen gas supplied to the RIE of the second step is set to be larger than the flow rate of the oxygen gas supplied to the RIE of the first step and the third step. The second region R2 that has a larger tilt with respect to the Z-direction than the first region R1 and the third region R3 is formed thereby.

Figure 3B:
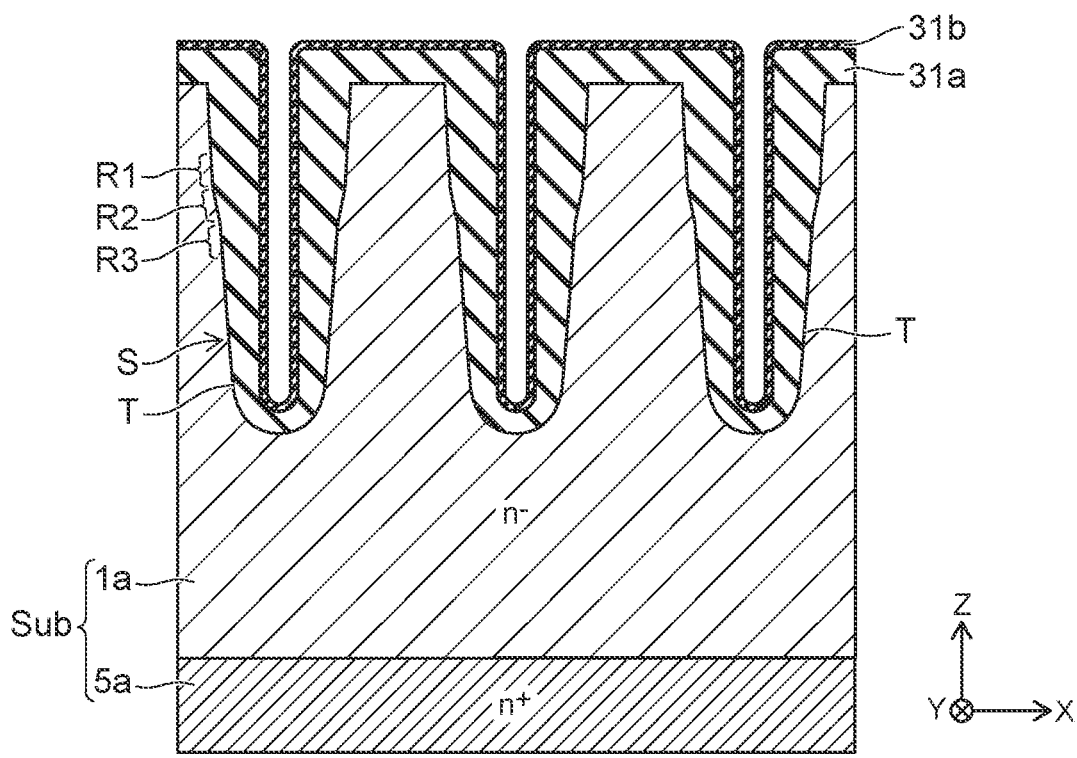

A first insulating layer 31a is formed along the upper surface of the n⁻-type semiconductor region 1a and the inner surface of the trench T. The first insulating layer 31a is formed by performing thermal oxidation of the semiconductor substrate Sub. Or, the first insulating layer 31a may be formed by chemical vapor deposition (CVD). As illustrated in FIG. 3B, a second insulating layer 31b is formed along the surface of the first insulating layer 31a by CVD. The first insulating layer 31a and the second insulating layer 31b include silicon oxide. The second insulating layer 31b further includes boron. The thickness of the second insulating layer 31b is thinner than the thickness of the first insulating layer 31a.

Figure 4A:
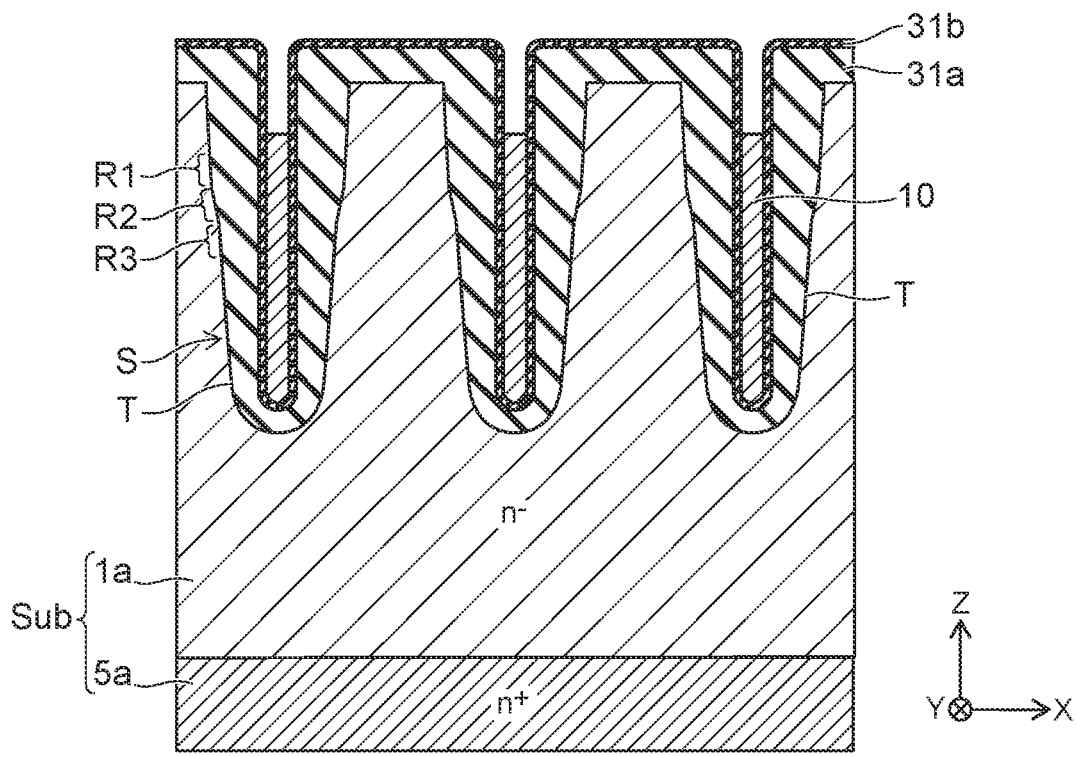

A conductive layer that fills the trench T is formed on the second insulating layer 31b by CVD. The conductive layer includes polysilicon. The conductive layer may include a conductive impurity (e.g., phosphorus). The upper surface of the conductive layer is caused to recede by removing a portion of the conductive layer by chemical dry etching (CDE), etc. Thereby, as illustrated in FIG. 4A, the multiple conductive portions 10 are formed respectively inside the multiple trenches T.

Figure 4B:
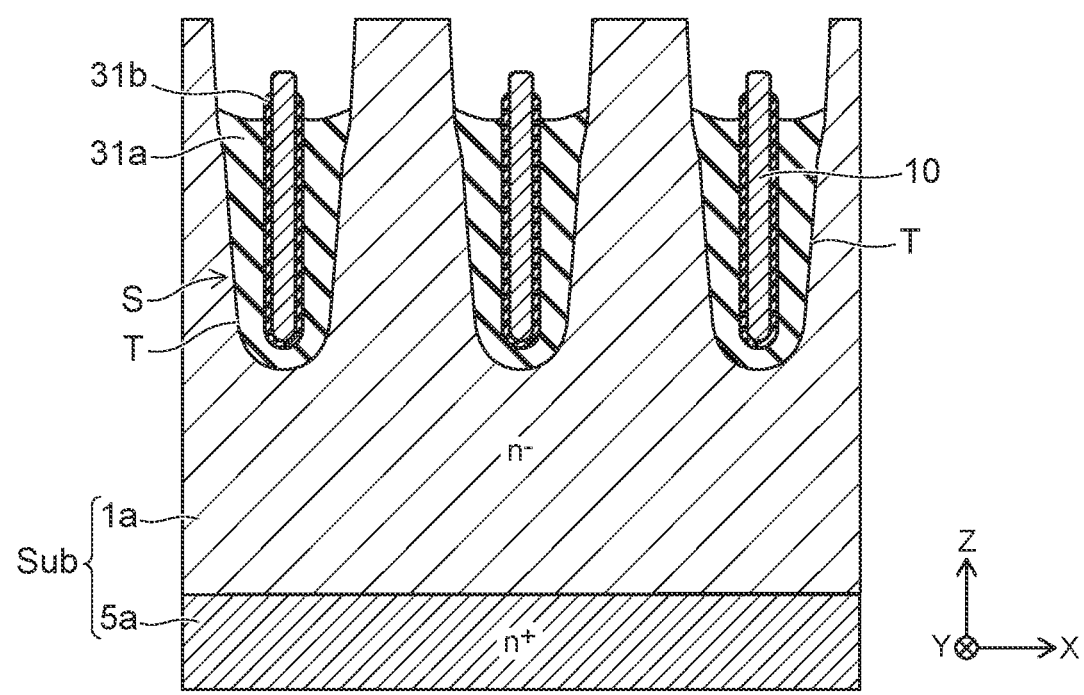

The upper surface of the first insulating layer 31a and the upper surface of the second insulating layer 31b are caused to recede by removing a portion of the first insulating layer 31a and a portion of the second insulating layer 31b by wet etching or CDE. As illustrated in FIG. 4B, the upper portion of the conductive portion 10, the upper surface of the n⁻-type semiconductor region 1a, and a portion of the inner wall of the trench T are exposed thereby. At this time, the portion of the first insulating layer 31a and the portion of the second insulating layer 31b are removed so that the upper end of the second insulating layer 31b is positioned lower than the upper end of the conductive portion 10, and the upper end of the first insulating layer 31a is positioned lower than the upper end of the second insulating layer 31b.

The upper portion of the conductive portion 10, the upper surface of the n⁻-type semiconductor region 1a, and a portion of the inner wall of the trench T are oxidized by oxidation treatment. Oxygen adsorbs easily to the second insulating layer 31b because the second insulating layer 31b includes boron. A portion of the oxygen adsorbed to the second insulating layer 31b is supplied to the conductive portion 10 and causes the conductive portion 10 to oxidize. The oxidization of the conductive portion 10 is promoted thereby. The oxidization of the conductive portion 10 is promoted further by the conductive portion 10 including a conductive impurity.

Figure 5A:
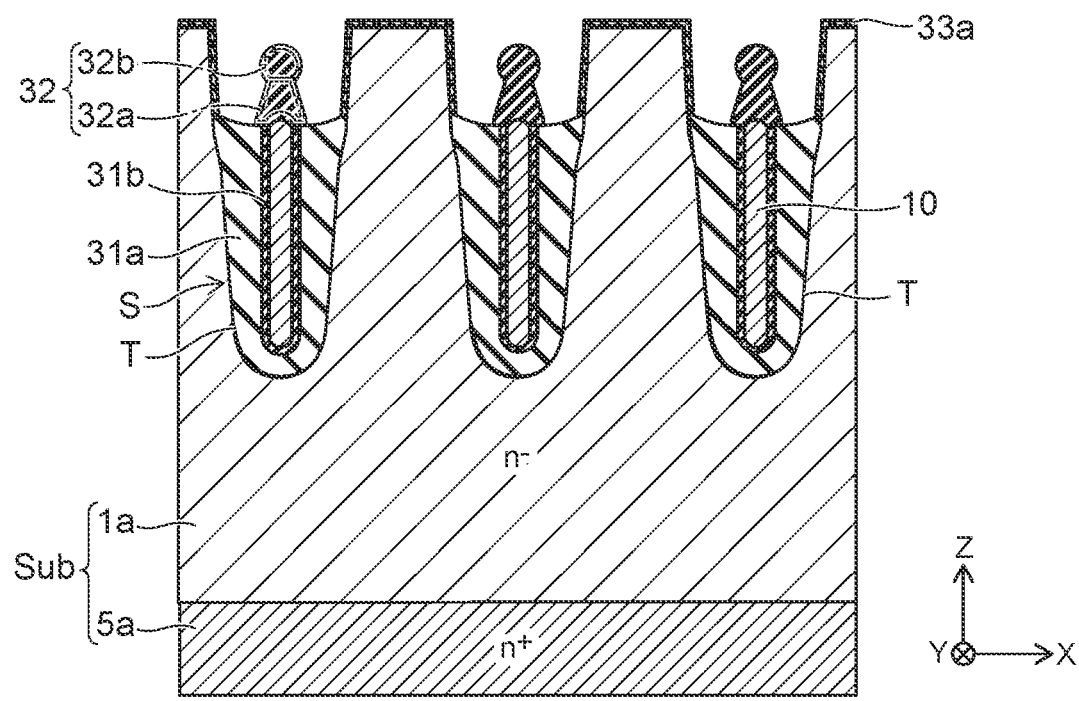

As illustrated in FIG. 5A, the insulating portion 32 is formed by oxidation of the conductive portion 10; and a third insulating layer 33a is formed by oxidation of the surface of the n⁻-type semiconductor region 1a. The insulating portion 32 includes the first insulating part 32a of which the length in the X-direction becomes shorter upward. The first insulating part 32a includes a portion of the second insulating layer 31b and a portion of the oxidized conductive portion 10. In the example, the insulating portion 32 includes the second insulating part 32b positioned higher than the first insulating part 32a. The length in the X-direction of the second insulating part 32b becomes longer upward. The second insulating part 32b includes another portion of the oxidized conductive portion 10.

Figure 5B:
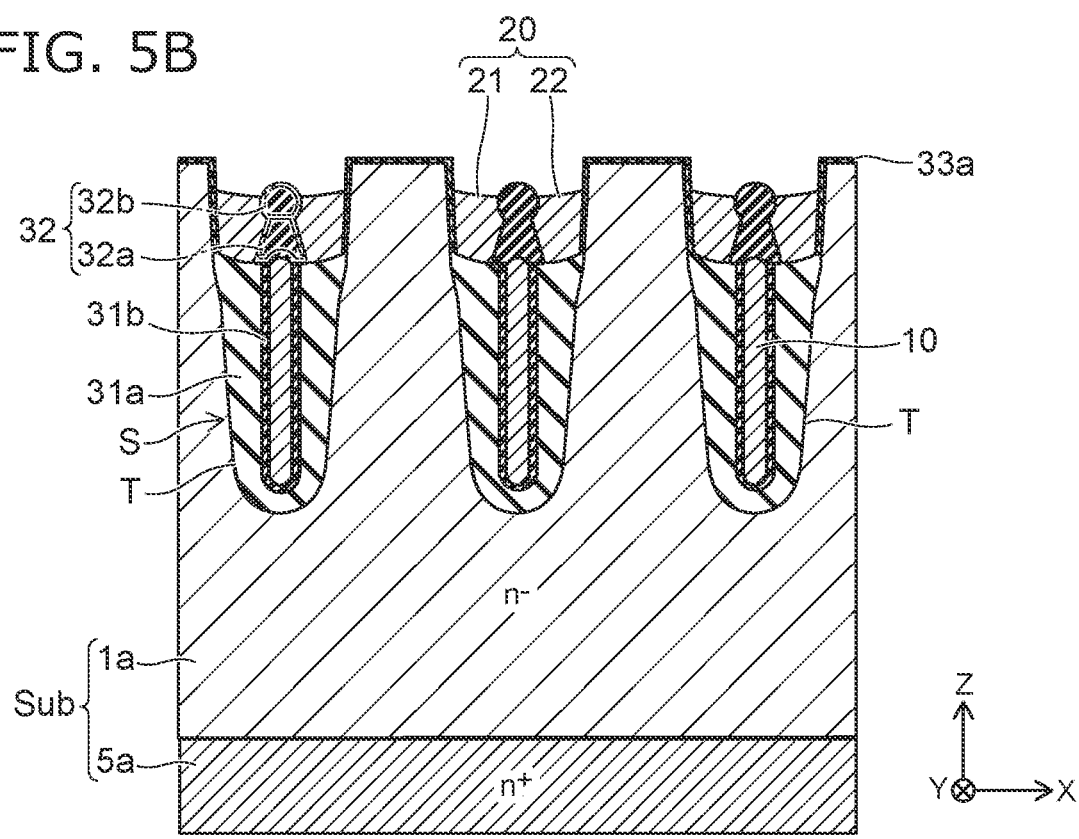

A conductive layer that fills the trench T is formed on the first insulating layer 31a, the second insulating layer 31b, the insulating portion 32, and the third insulating layer 33a by CVD. The conductive layer includes polysilicon. The conductive layer may include a conductive impurity (e.g., phosphorus). The upper surface of the conductive layer is caused to recede by removing a portion of the conductive layer by CDE, etc. Thereby, as illustrated in FIG. 5B, the multiple gate electrodes 20 are formed respectively inside the multiple trenches T. Each gate electrode 20 includes the first electrode part 21 and the second electrode part 22 divided in the X-direction by the insulating portion 32.

Figure 6A:
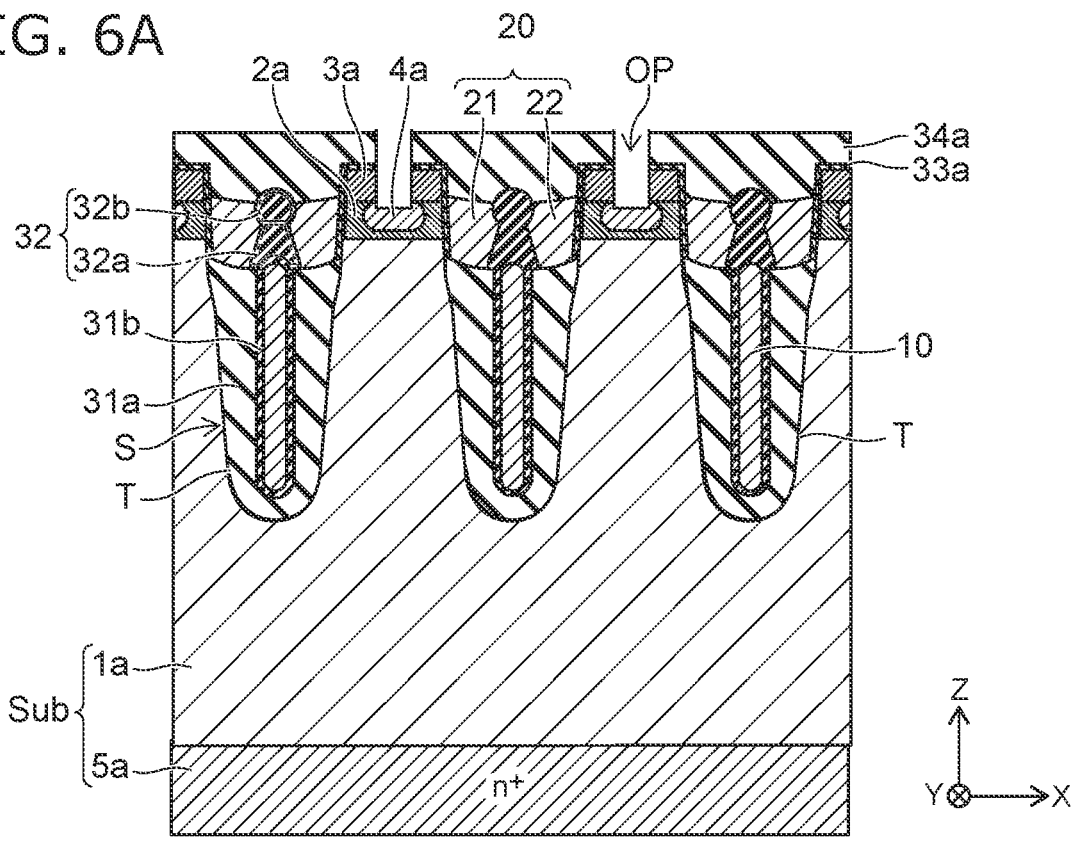

A p-type semiconductor region 2a and an n⁺-type semiconductor region 3a are formed in the upper portion of the n⁻-type semiconductor region 1a between the trenches T by sequentially ion-implanting a p-type impurity and an n-type impurity. An insulating layer 34a that covers the multiple gate electrodes 20 is formed. A portion of the third insulating layer 33a and a portion of the insulating layer 34a are removed. Openings OP are formed thereby. For example, the openings OP are formed by removing a portion of each n⁺-type semiconductor region 3a and a portion of each p-type semiconductor region 2a. The openings OP respectively pass through the n⁺-type semiconductor regions 3a and reach the p-type semiconductor regions 2a. As illustrated in FIG. 6A, p⁺-type semiconductor regions 4a are formed by ion-implanting a p-type impurity into the p-type semiconductor regions 2a via the openings OP.

Figure 6B:
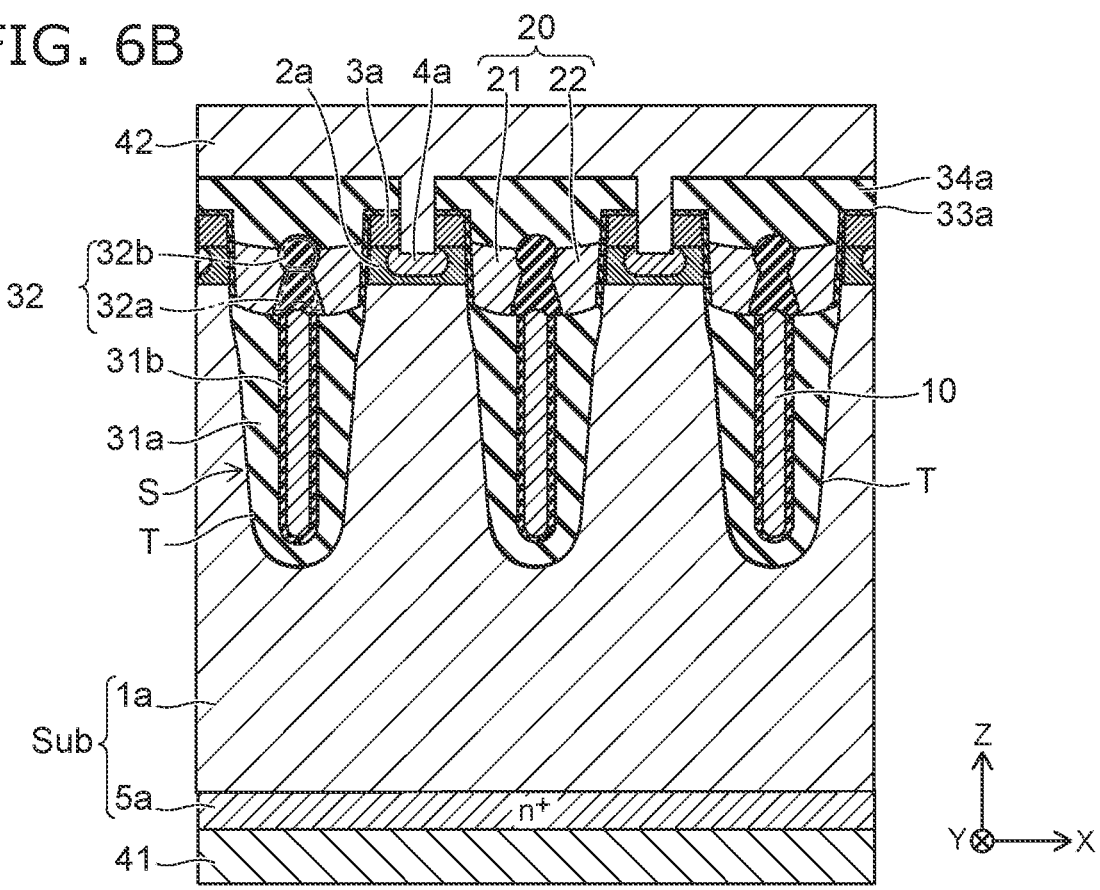

The source electrode 42 that fills the openings OP is formed on the insulating layer 34a. Subsequently, the lower surface of the semiconductor substrate Sub is polished until the n⁺-type semiconductor region 5a has a prescribed thickness. As illustrated in FIG. 6B, the drain electrode 41 is formed on the polished lower surface. By the processes recited above, the semiconductor device 100 illustrated in FIG. 1 and FIG. 2 is manufactured.

Figure 7:
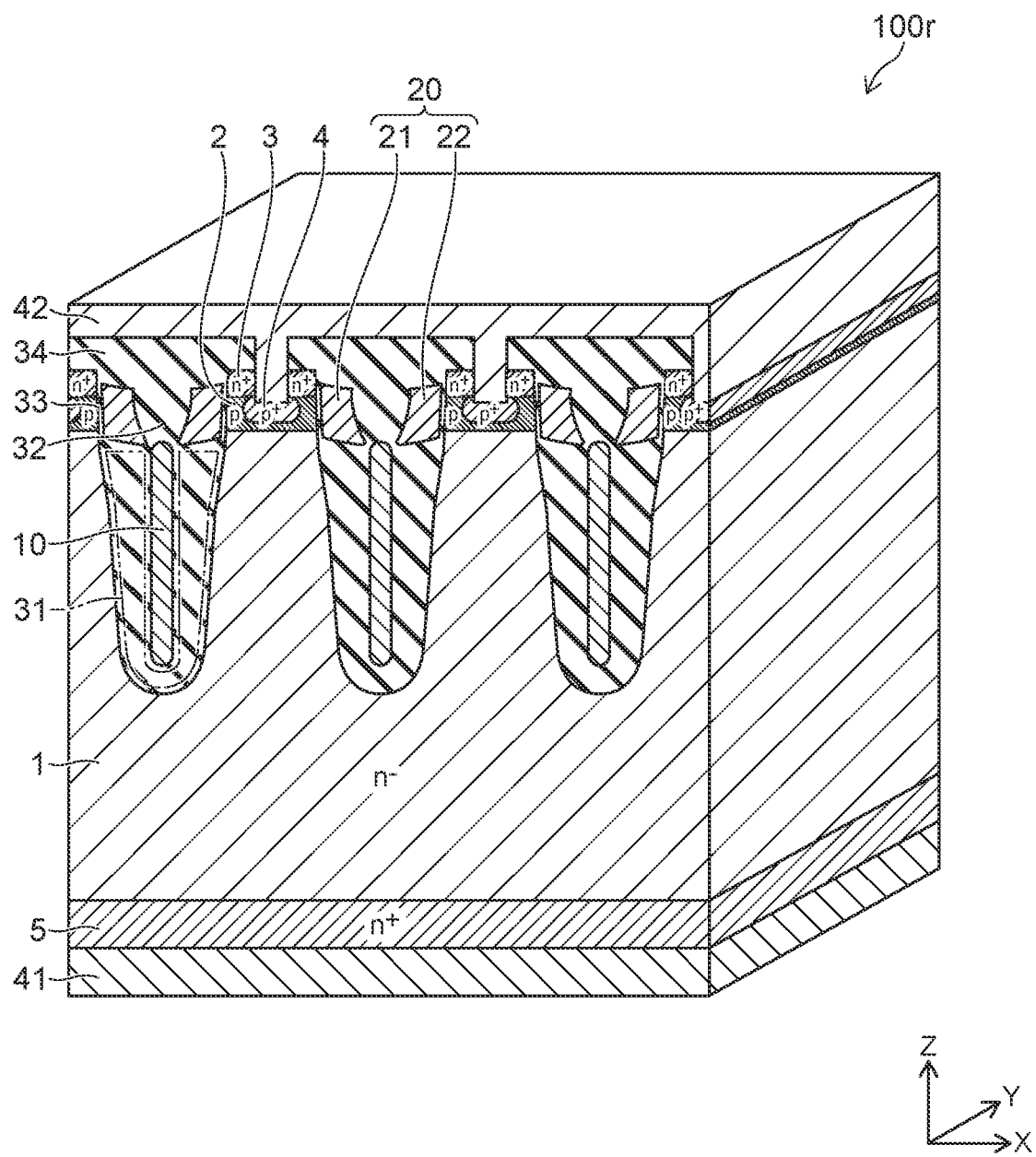
FIG. 7 is a perspective cross-sectional view illustrating a portion of a semiconductor device according to a reference example.

FIG. 7 is a perspective cross-sectional view illustrating a portion of a semiconductor device according to a reference example.

Effects of the semiconductor device according to the embodiment will now be described with reference to FIG. 7.

In the semiconductor device 100r according to the reference example illustrated in FIG. 7, the length in the X-direction of the second insulating portion 32 becomes shorter downward. In the semiconductor device 100r, the second insulating portion 32 does not include the first insulating part 32a.

In the semiconductor device 100r according to the reference example, a portion of the gate electrode 20 is disposed proximally to the conductive portion 10. Also, the portion of the gate electrode 20 protrudes toward the conductive portion 10. In other words, the curvature of the portion of the gate electrode 20 is large. Therefore, when a potential difference is generated between the gate electrode 20 and the conductive portion 10 electrically connected to the source electrode 42, the electric field intensity at the vicinity of the portion of the gate electrode 20 may become high; and dielectric breakdown between the conductive portion 10 and the gate electrode 20 may occur.

In the semiconductor device 100 according to the embodiment, the second insulating portion 32 includes the first insulating part 32a of which the length in the X-direction becomes longer downward. Further, the length in the Z-direction of the first insulating part 32a is longer than the length in the Z-direction of the second insulating part 32b provided on the first insulating part 32a. According to this configuration, compared to the semiconductor device 100r, the distance between the gate electrode 20 and the conductive portion 10 can be long. By providing the first insulating part 32a, the curvature of a portion of the gate electrode 20 opposing the conductive portion 10 can be small. The likelihood of dielectric breakdown occurring between the conductive portion 10 and the gate electrode 20 can be reduced thereby.

FIG. 8A, FIG. 8B, FIG. 9A, and FIG. 9B are process cross-sectional views illustrating a manufacturing method according to a first reference example.

Figure 10A:
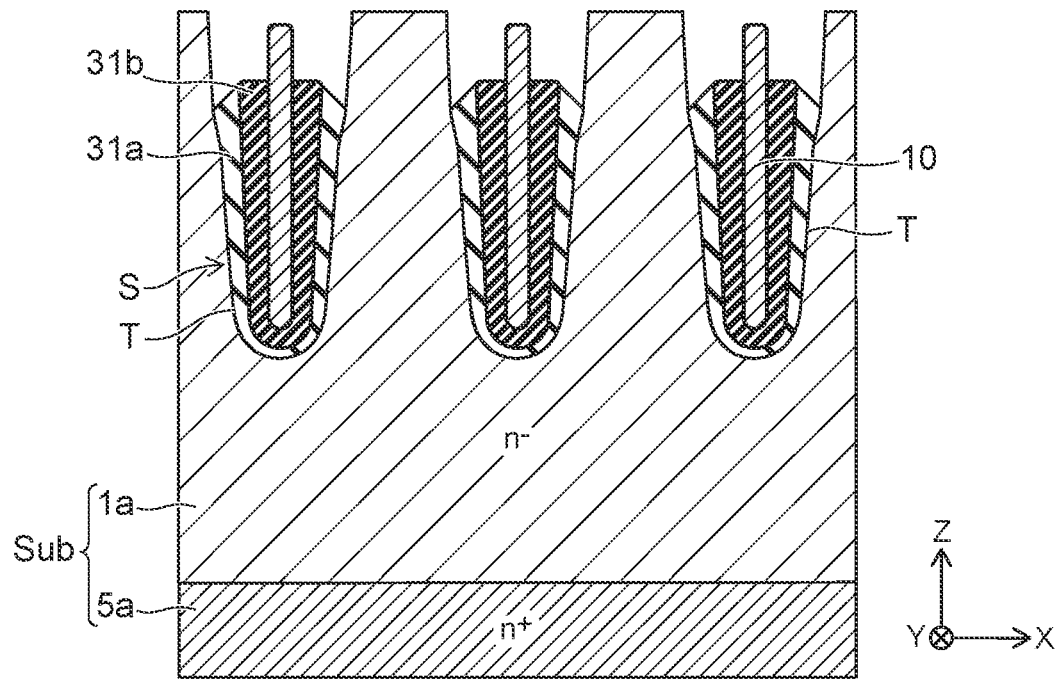
FIG. 10A to FIG. 12B are process cross-sectional views illustrating the manufacturing method according to the third reference example.
Figure 10B:
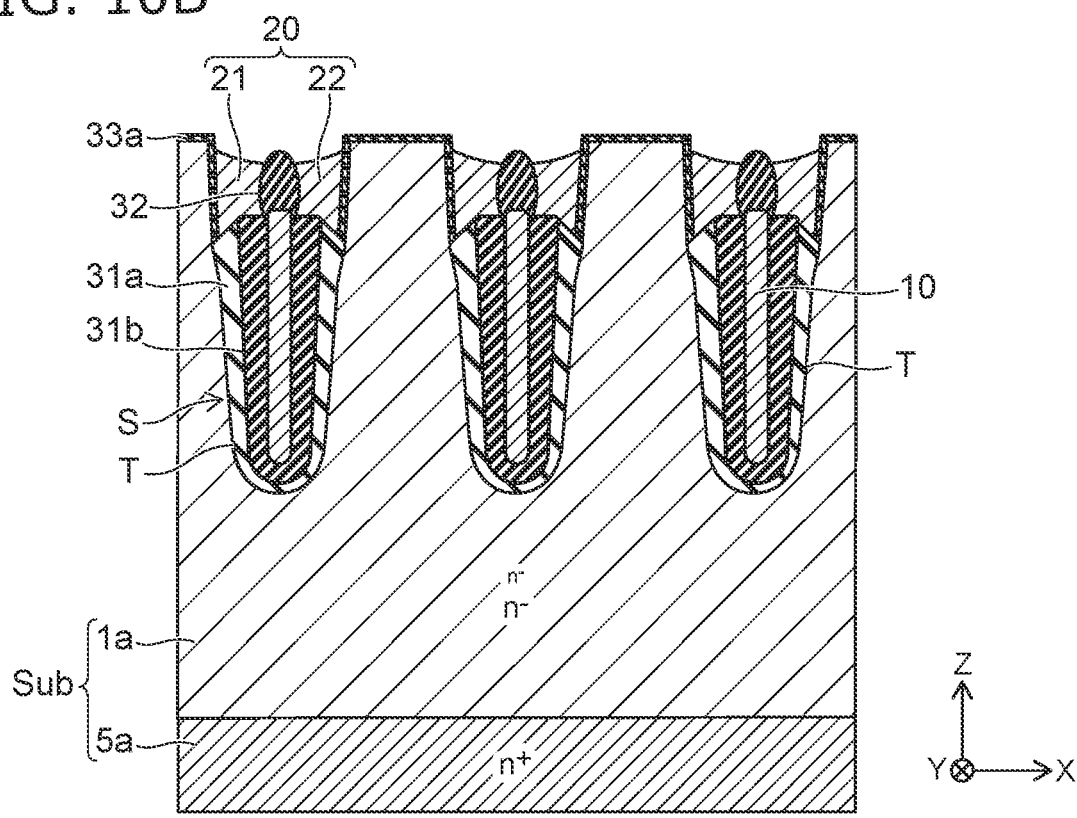

FIG. 10A and FIG. 10B are process cross-sectional views illustrating a manufacturing method according to a second reference example.

FIG. 11A, FIG. 11B, FIG. 12A, and FIG. 12B are process cross-sectional views illustrating a manufacturing method according to a third reference example.

Effects of the manufacturing method according to the embodiment will now be described with reference to FIG. 8A to FIG. 12B.

Figure 8A:
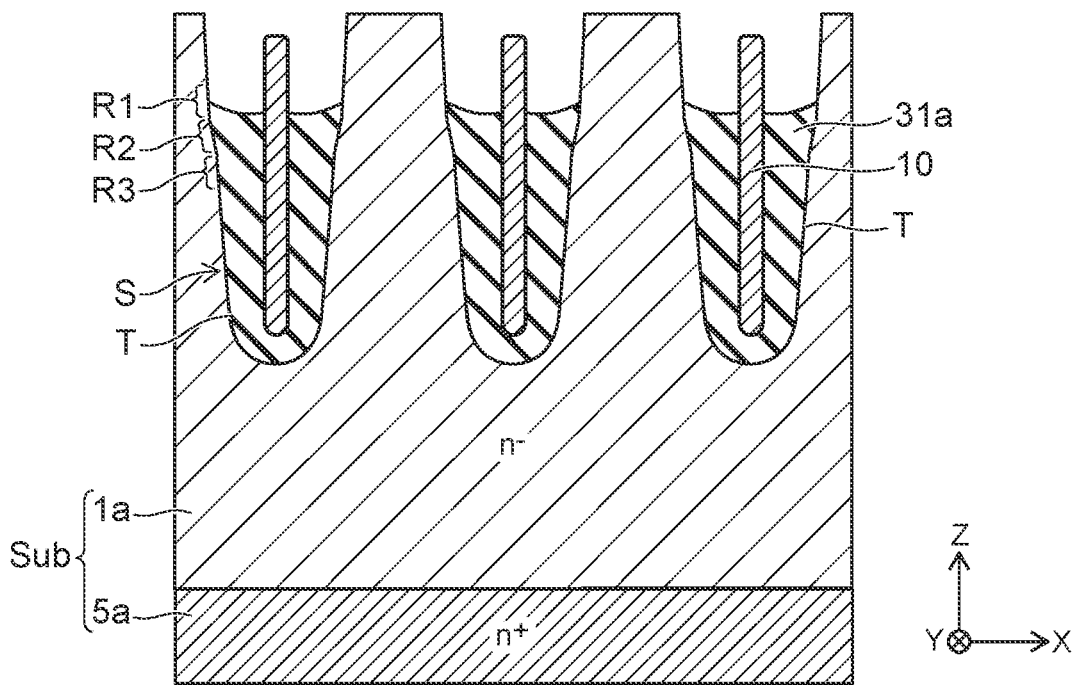
FIG. 8A to FIG. 9B are process cross-sectional views illustrating the manufacturing method according to the first reference example.
Figure 8B:
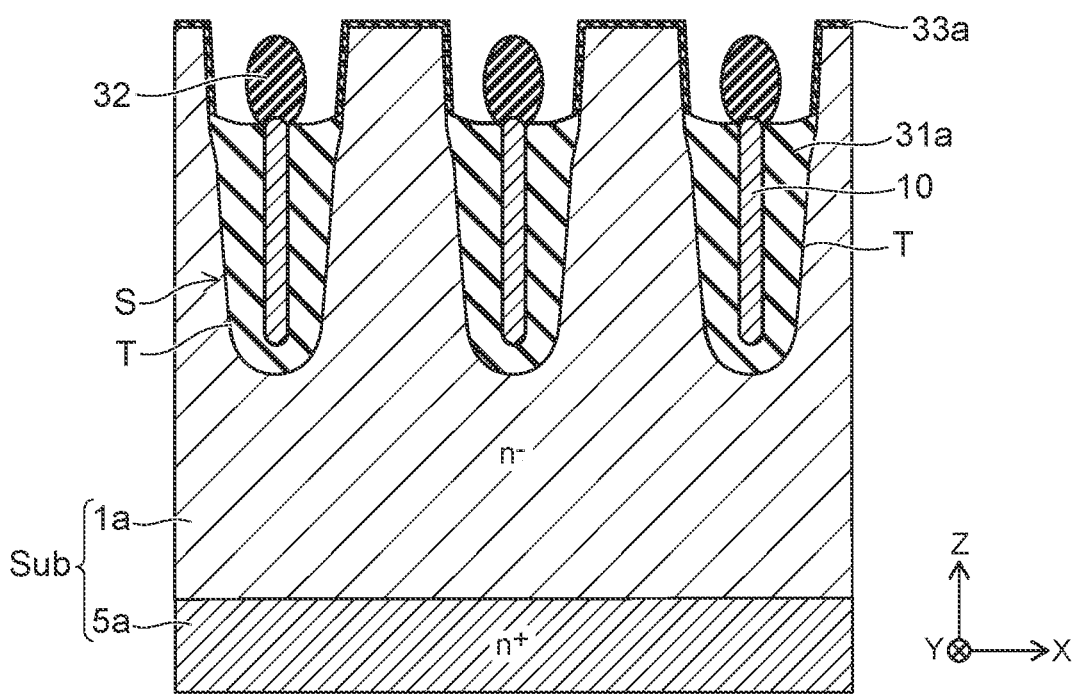

In the manufacturing method according to the first reference example, the second insulating layer 31b is not formed as illustrated in FIG. 8A. In the case where the second insulating layer 31b is not formed, compared to the manufacturing method according to the embodiment, the thickness of the insulating portion 32 lower portion is thinner by the amount of the thickness of the second insulating layer 31b. As a result, according to the manufacturing method according to the reference example, the length in the X-direction of the insulating portion 32 becomes shorter downward as illustrated in FIG. 8B. In other words, the insulating portion 32 has a configuration that does not include the first insulating part 32a.

Figure 9A:
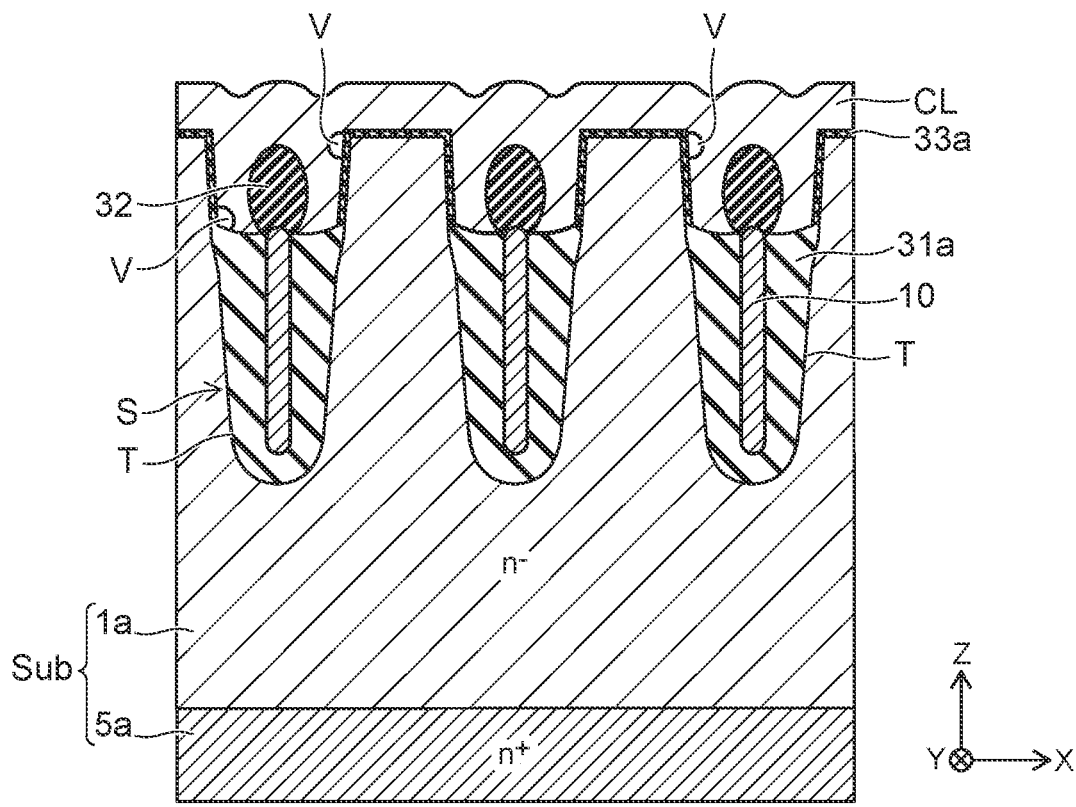
Figure 9B:
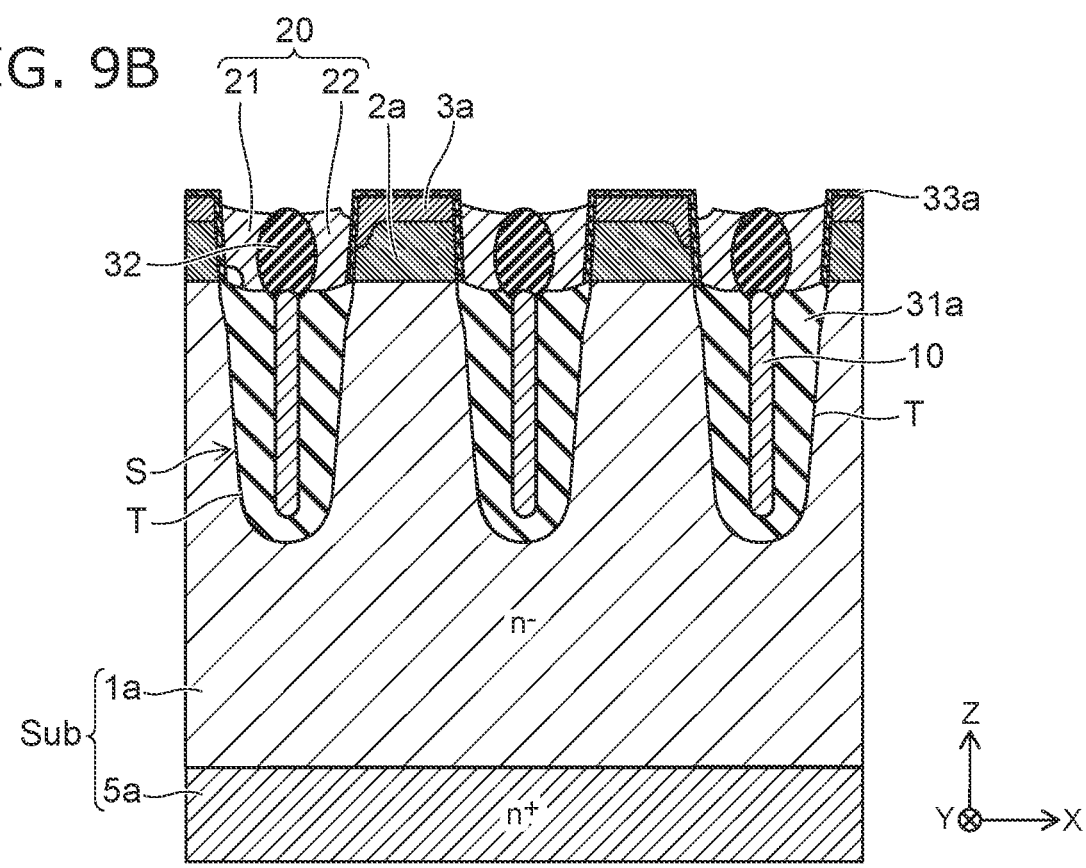

In the case where the length in the X-direction of the insulating portion 32 becomes shorter downward, the angle between the side wall of the insulating portion 32 and the upper surface of the first insulating layer 31a is acute. Therefore, as illustrated in FIG. 9A, voids V form easily inside a conductive layer CL for forming the gate electrode 20 when the conductive layer CL is formed. When the upper surface of the conductive layer CL in which the voids V are formed is caused to recede, recesses occur in the upper surface of the gate electrode 20 in the portions where the voids V are formed as illustrated in FIG. 9B. If recesses exist in the upper surface of the gate electrode 20, the n-type impurity is ion-implanted deeply into the semiconductor substrate Sub due to the recesses when ion-implanting the n-type impurity to form the n$^+$-type semiconductor region 3a; and a portion of the n$^+$-type semiconductor region 3a becomes deep. The distance in the Z-direction between the n$^-$-type semiconductor region 1a and the portion of the n$^+$-type semiconductor region 3a is shorter than the distance in the Z-direction between the other n$^+$-type semiconductor regions 3a and the n$^-$-type semiconductor region 1a. Therefore, a current flows through the inversion layer of the p-type semiconductor region 2a even when the voltage applied to the gate electrode 20 is low. The fluctuation of the threshold voltage for switching the semiconductor device to the on-state becomes large.

The second insulating layer 31b is formed in the manufacturing method according to the embodiment. Then, when removing a portion of the first insulating layer 31a and a portion of the second insulating layer 31b, the upper end of the second insulating layer 31b is caused to be positioned lower than the upper end of the conductive portion 10; and the upper end of the first insulating layer 31a is caused to be positioned lower than the upper end of the second insulating layer 31b. Thereby, the first insulating part 32a can be formed in the insulating portion 32 when forming the insulating portion 32 by oxidizing a portion of the conductive portion 10. In other words, the length in the X-direction of the lower portion of the insulating portion 32 can be longer. Thereby, the formation of voids inside the conductive layer can be suppressed when providing the conductive layer for forming the gate electrode 20. As a result, the fluctuation of the threshold voltage for switching the semiconductor device to the on-state can be small; and a semiconductor device having high reliability can be manufactured.

When removing a portion of the first insulating layer 31a and a portion of the second insulating layer 31b, it is desirable for the difference between the etching rate of the first insulating layer 31a and the etching rate of the second insulating layer 31b to be large. By setting the difference to be large, the distance in the Z-direction between the upper end of the second insulating layer 31b and the upper end of the first insulating layer 31a after removing the portion of the first insulating layer 31a and the portion of the second insulating layer 31b can be long. By lengthening the distance, the length in the Z-direction of the first insulating part 32a can be longer. Thereby, the occurrence of voids inside the gate electrode 20 can be suppressed further; and a semiconductor device that has higher reliability can be manufactured.

For example, it is more desirable for the first insulating layer 31a to be formed by CVD than to be formed by thermal oxidation of the semiconductor substrate Sub. Compared to thermal oxidation of the semiconductor substrate Sub, the structure of the first insulating layer 31a can be coarser by forming the first insulating layer 31a by CVD. Therefore, the etching rate of the first insulating layer 31a can be large; and the difference between the etching rate of the first insulating layer 31a and the etching rate of the second insulating layer 31b can be large.

It is desirable for the boron concentration of the second insulating layer 31b to be higher than the boron concentration of the first insulating layer 31a. According to such a concentration relationship, the difference between the etching rate of the second insulating layer 31b and the etching rate of the first insulating layer 31a can be even larger.

It is desirable for the thickness of the second insulating layer 31b to be thinner than the thickness of the first insulating layer 31a. FIG. 10A and FIG. 10B illustrate manufacturing processes when the thickness of the second insulating layer 31b is thicker than the thickness of the first insulating layer 31a. When the second insulating layer 31b is thicker than the first insulating layer 31a, the distance in the X-direction between the second insulating layer 31b and the third insulating layer 33a becomes short as illustrated in FIG. 10B when forming the insulating portion 32 and the third insulating layer 33a. If the gate electrode 20 is formed in this state, the curvature of a portion of the gate electrode 20 provided between the second insulating layer 31b and the third insulating layer 33a becomes large. Therefore, the electric field intensity at the vicinity of the portion of the gate electrode 20 may become high; and breakdown of the semiconductor device may occur. By setting the thickness of the second insulating layer 31b to be thinner than the thickness of the first insulating layer 31a, the occurrence of voids and portions having large curvatures can be suppressed; and a semiconductor device that has higher reliability can be manufactured.

Figure 11A:
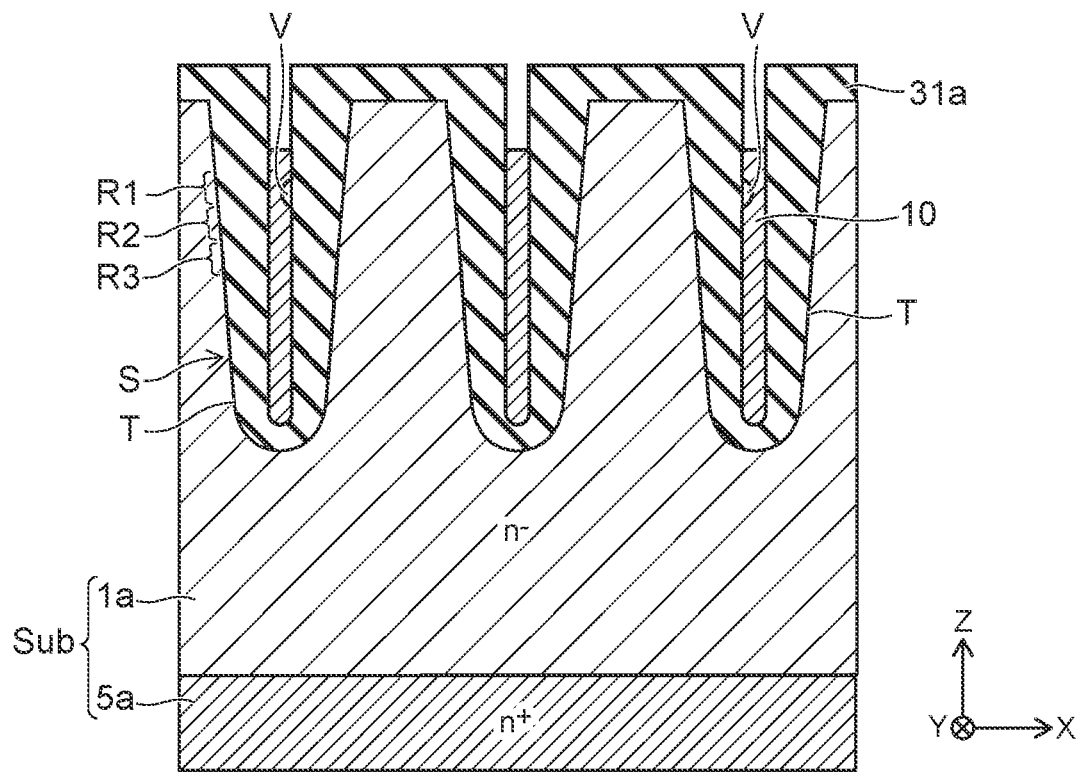
Figure 11B:
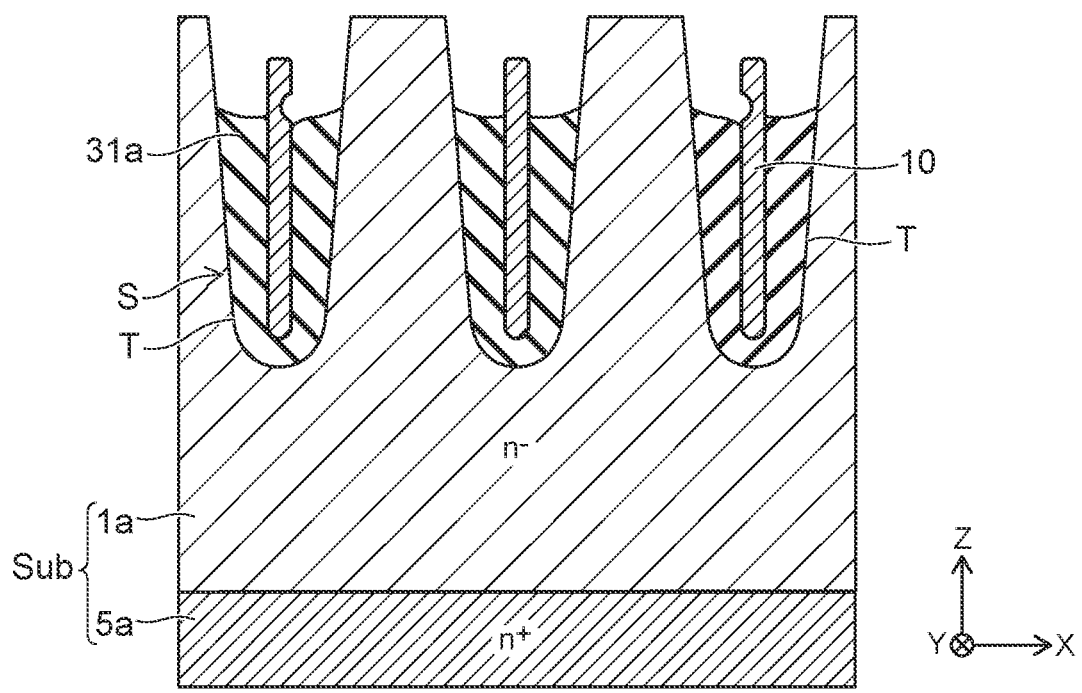
Figure 12A:
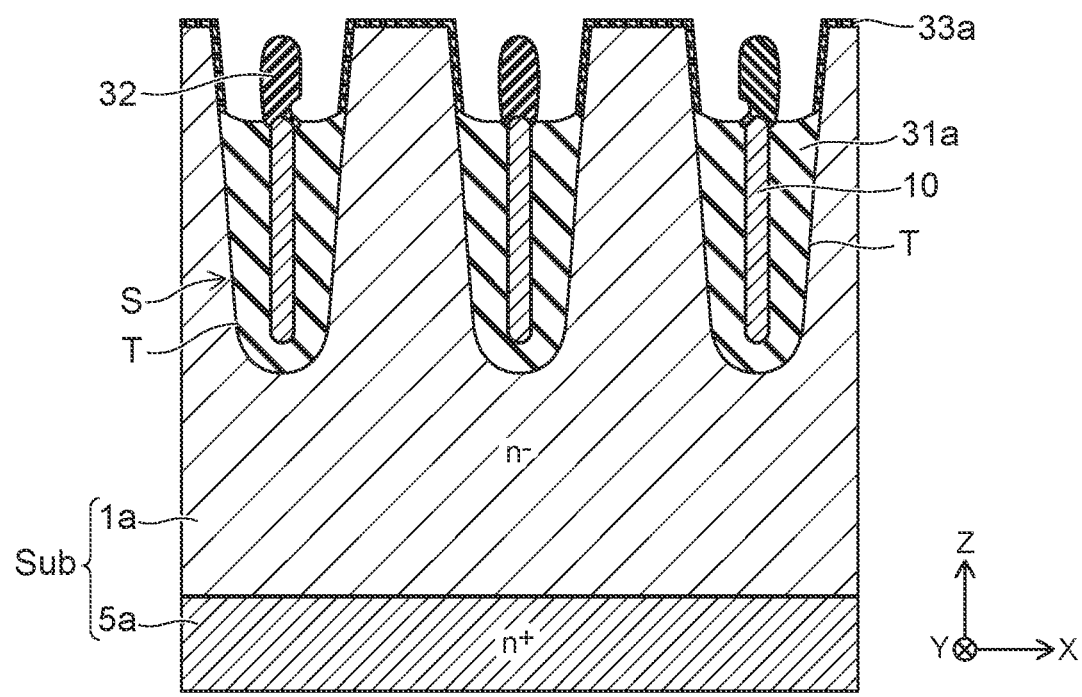
Figure 12B:
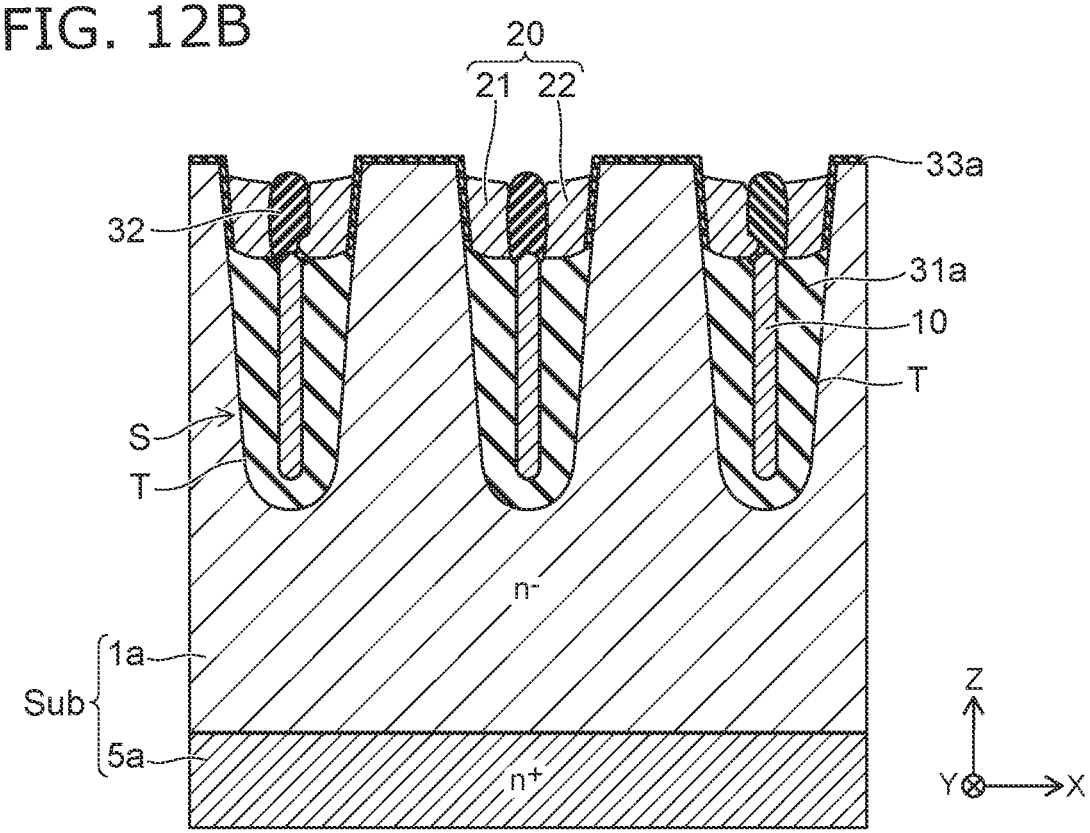

FIG. 11A to FIG. 12B illustrate the state in which the tilt with respect to the Z-direction of the second region R2 is the same as the tilt with respect to the Z-direction of the first region R1 and the tilt with respect to the Z-direction of the third region R3. Namely, in the example illustrated in FIG. 11A to FIG. 12B, the tilt with respect to the Z-direction of a side wall S of the trench T is uniformly small. When the tilt of the side wall S is uniformly small, the voids V form easily as illustrated in FIG. 11A when the conductive portion 10 is formed. If the voids V are formed, at least a portion of the voids V may be exposed when the upper surface of the first insulating layer 31a is caused to recede as illustrated in FIG. 11B. Subsequently, when the portions in which the voids V are formed are oxidized to form the insulating portion 32, the configuration of the insulating portion 32 is changed by the voids V as illustrated in FIG. 12A. As a result, when forming the gate electrode 20 as illustrated in FIG. 12B, the distance between the conductive portion 10 and the gate electrode 20 may become short locally; and breakdown of the semiconductor device may occur.

Due to this problem, it is desirable for the tilt with respect to the Z-direction of the second region R2 of the side wall S to be larger than the tilt with respect to the Z-direction of the third region R3 of the side wall S when forming the trench T as illustrated in FIG. 3A. According to this structure, the material is deposited easily to a deep portion of the trench T. For example, the occurrence of voids inside the conductive portion 10 can be suppressed when forming the conductive portion 10 inside the trench T. Therefore, a semiconductor device that has higher reliability can be manufactured.

Also, it is desirable for the tilt with respect to the Z-direction of the first region R1 of the side wall of the trench T to be smaller than the tilt with respect to the Z-direction of the second region R2 of the side wall of the trench T. According to this structure, the dimension in the X-direction of the trench T upper end can be short. Because the dimension in the X-direction of the trench T upper end is short, more trenches T per unit area of the semiconductor substrate Sub can be formed. As a result, the channel density of the semiconductor device that is manufactured can be large; and the on-resistance of the semiconductor device can be reduced.

In each of the embodiments described above, it is possible to confirm the relative levels of the impurity concentrations between the semiconductor regions by using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. It is possible to measure the impurity concentration in each semiconductor region by, for example, SIMS (secondary ion mass spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A semiconductor device, comprising:
a first electrode;
a first semiconductor region provided on the first electrode and electrically connected to the first electrode, the first semiconductor region being of a first conductivity type;
a plurality of second semiconductor regions provided on the first semiconductor region, the second semiconductor regions being of a second conductivity type;
a plurality of third semiconductor regions selectively provided respectively on the second semiconductor regions, the third semiconductor regions being of the first conductivity type;
a first conductive portion provided inside the first semiconductor region with a first insulating portion interposed therebetween;
a gate electrode provided on the first conductive portion and the first insulating portion and separated from the first conductive portion, the gate electrode including
a first electrode part opposing, in a first direction with a first gate insulating portion interposed therebetween, a portion of the first semiconductor region, one of the second semiconductor regions, and one of the third semiconductor regions, wherein the first direction is perpendicular to a second direction, the second direction extending from the first electrode toward the first semiconductor region, and
a second electrode part positioned between the first electrode part and another one of the third semiconductor regions in the first direction, the second electrode part opposing, with a second gate insulating portion interposed therebetween, another portion of the first semiconductor region, another one of the second semiconductor regions, and the another other one of the third semiconductor regions;
a second insulating portion provided between the first electrode part and the second electrode part in the first direction, the second insulating portion including
a first insulating part, a length between opposing boundaries in the first direction of the first insulating part becoming shorter along the second direction, and
a second insulating part including a sub-part positioned on the first insulating part, a length between opposing boundaries in the first direction of the sub-part becoming longer or being constant along the second direction; and
a second electrode provided on the second semiconductor regions and the third semiconductor regions, the second electrode being electrically connected to the second semiconductor regions, the third semiconductor regions, and the first conductive portion.

2. The device according to claim 1, wherein a length between opposing boundaries in the first direction of at least a portion of the first insulating part is longer than a length in the first direction of the first conductive portion.

3. The device according to claim 1, wherein a length between opposing boundaries in the first direction of at least a portion of the second insulating part is longer than a length in the first direction of the first conductive portion.

4. The device according to claim 1, wherein a boundary between the first insulating part and the second insulating part is arranged with the one of the second semiconductor regions and the other of the second semiconductor regions in the first direction.

5. The device according to claim 1, wherein a portion of the first conductive portion is arranged between the first electrode part and the second electrode part in the first direction.

6. The device according to claim 1, wherein
the first electrode part includes a first sub-part arranged adjacent to the first insulating part in the first direction, and
a length between opposing boundaries in the first direction of the first sub-part becoming longer along the second direction.

7. The device according to claim 6, wherein
the first electrode part includes a second sub-part arranged adjacent to the second insulating part in the first direction, and
a length between opposing boundaries in the first direction of the second sub-part becoming longer or being constant along the second direction.

8. The device according to claim 7, wherein
the second electrode part includes a first sub-part arranged adjacent to the first insulating part in the first direction, and
a length between opposing boundaries in the first direction of the first sub-part becoming longer along the second direction.

9. The device according to claim 8, wherein
the second electrode part includes a second sub-part arranged adjacent to the second insulating part in the first direction, and
a length between opposing boundaries in the first direction of the second sub-part becoming longer or being constant along the second direction.

10. The device according to claim 1, wherein the second insulating portion includes a silicon oxide and an impurity.

11. The device according to claim 10, wherein the impurity is boron.

12. The device according to claim 1, wherein a boundary between the first electrode part and the first insulating part is inclined with respect to the second direction.

13. The device according to claim 12, wherein a boundary between the second electrode part and the first insulating part is inclined with respect to the second direction.

14. The device according to claim 1, wherein the first insulating portion includes a third insulating part, and a fourth insulating part provided between the first semiconductor region and the third insulating part, and a boron concentration of the third insulating part is higher than a boron concentration of the fourth insulating part.

* * * * *